(12) United States Patent
Ponnuru et al.

(10) Patent No.: US 10,997,516 B2
(45) Date of Patent: May 4, 2021

(54) SYSTEMS AND METHODS FOR PREDICTING PERSISTENT MEMORY DEVICE DEGRADATION BASED ON OPERATIONAL PARAMETERS

(71) Applicant: Dell Products L.P., Round Rock, TX (US)

(72) Inventors: Viswanath Ponnuru, Bangalore (IN); K. N. Ravishankar, Bangalore (IN); Parmeshwr Prasad, Bengaluru (IN)

(73) Assignee: Dell Products L.P., Round Rock, TX (US)

( * ) Notice: Subject to any disclaimer, the term of this patent is extended or adjusted under 35 U.S.C. 154(b) by 810 days.

(21) Appl. No.: 15/843,075

(22) Filed: Dec. 15, 2017

(65) Prior Publication Data

US 2019/0188589 A1 Jun. 20, 2019

(51) Int. Cl.
| | | |
|---|---|---|
| *G06F 12/02* | (2006.01) | |
| *G06N 7/00* | (2006.01) | |
| *G06F 3/06* | (2006.01) | |
| *G11C 29/52* | (2006.01) | |
| *G06F 11/10* | (2006.01) | |
| *G11C 5/04* | (2006.01) | |
| *G11C 7/04* | (2006.01) | |
| *G11C 29/04* | (2006.01) | |

(52) U.S. Cl.
CPC .......... *G06N 7/005* (2013.01); *G06F 3/0619* (2013.01); *G06F 3/0653* (2013.01); *G06F 3/0679* (2013.01); *G06F 11/1048* (2013.01); *G11C 5/04* (2013.01); *G11C 7/04* (2013.01); *G11C 29/52* (2013.01); *G06F 11/1068* (2013.01); *G06F 12/0246* (2013.01); *G11C 2029/0409* (2013.01); *G11C 2029/0411* (2013.01)

(58) Field of Classification Search
None
See application file for complete search history.

(56) References Cited

U.S. PATENT DOCUMENTS 10,394,618 B2* 8/2019 Foxworth ............. G06F 9/5094
10,579,359 B2* 3/2020 Hobson ..................... G06F 8/65

OTHER PUBLICATIONS

"NVDIMM DSM Interface", (c) 2017, Intel Corporation, p. 1,2, 9-14, 34, 35.*

* cited by examiner

*Primary Examiner* — Brian R Peugh
(74) *Attorney, Agent, or Firm* — Jackson Walker L.L.P.

(57) ABSTRACT

In accordance with embodiments of the present disclosure, an information handling system may include a processor, a memory system communicatively coupled to the processor, the memory system comprising one or more persistent memory modules, each of the one or more persistent memory modules comprising a volatile memory and a non-volatile memory, and a management controller communicatively coupled to the processor and the memory system. The management controller may be configured to correlate temperature sensor information with one or more other operational parameters associated with the one or more persistent memory modules and predict a likelihood of degradation of the one or more persistent memory modules based on correlation of the temperature sensor information with the one or more other operational parameters.

18 Claims, 3 Drawing Sheets

SYSTEMS AND METHODS FOR PREDICTING PERSISTENT MEMORY DEVICE DEGRADATION BASED ON OPERATIONAL PARAMETERS

TECHNICAL FIELD

The present disclosure relates in general to information handling systems, and more particularly to systems and methods for predicting persistent memory device degradation based on operational parameters.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are increasingly using persistent memory technologies such as Non-Volatile Dual In-line Memory Modules (NVDIMMs), including NVDIMM-N. An NVDIMM is a memory module that may retain data even when electrical power is removed either from an unexpected power loss, system crash or from a normal system shutdown. To enable such functionality, an NVDIMM may include a traditional dynamic random access memory (DRAM) which may store data during normal operation when electrical power is available from a power supply unit and a flash memory (e.g., NAND flash) to back up data present in the DRAM when a loss of electrical power from the power supply unit occurs. A battery, capacitor, or other energy storage device either internal or external to the NVDIMM may supply electrical energy for a "save" operation to transfer data from the DRAM to the flash memory in response to a power loss event from the power supply unit.

An existing problem with DRAM threshold policies is that both correctable and uncorrectable errors are marked as degraded even though advanced error correction code (ECC) capabilities and scrub protocols effectively address all correctable errors. In many cases, correctable errors are transient and will resolve themselves with little or no administrator intervention. However, uncorrectable errors may cause an information handling system to crash, increasing downtime and potentially causing data loss.

On NAND flash, the "retention" parameter is often the parameter used to define when failure occurs. The retention parameter is very sensitive to the external environment of a NAND flash, and high temperature tends to reduce duration of retention. A number of read cycles can also degrade retention.

Because an NVDIMM-N device may include both DRAM and NAND flash, an intelligent approach is desired to determine device degradation and replacement.

SUMMARY

In accordance with the teachings of the present disclosure, the disadvantages and problems associated with determining health of a non-volatile memory module in an information handling system may be reduced or eliminated.

In accordance with embodiments of the present disclosure, an information handling system may include a processor, a memory system communicatively coupled to the processor, the memory system comprising one or more persistent memory modules, each of the one or more persistent memory modules comprising a volatile memory and a non-volatile memory, and a management controller communicatively coupled to the processor and the memory system. The management controller may be configured to correlate temperature sensor information with one or more other operational parameters associated with the one or more persistent memory modules and predict a likelihood of degradation of the one or more persistent memory modules based on correlation of the temperature sensor information with the one or more other operational parameters.

In accordance with these and other embodiments of the present disclosure, a method for use in an information handling system comprising a memory system comprising one or more persistent memory modules, each of the one or more persistent memory modules comprising a volatile memory and a non-volatile memory. The method may include correlating temperature sensor information with one or more other operational parameters associated with the one or more persistent memory modules and predicting a likelihood of degradation of the one or more persistent memory modules based on correlation of the temperature sensor information with the one or more other operational parameters.

In accordance with these and other embodiments of the present disclosure, an article of manufacture may include a non-transitory computer-readable medium and computer-executable instructions carried on the computer-readable medium, the instructions readable by a processor, the instructions, when read and executed, for causing the processor to, in an information handling system comprising a memory system comprising one or more persistent memory modules, each of the one or more persistent memory modules comprising a volatile memory and a non-volatile memory: (i) correlate temperature sensor information with one or more other operational parameters associated with the one or more persistent memory modules; and (ii) predict a likelihood of degradation of the one or more persistent memory modules based on correlation of the temperature sensor information with the one or more other operational parameters.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
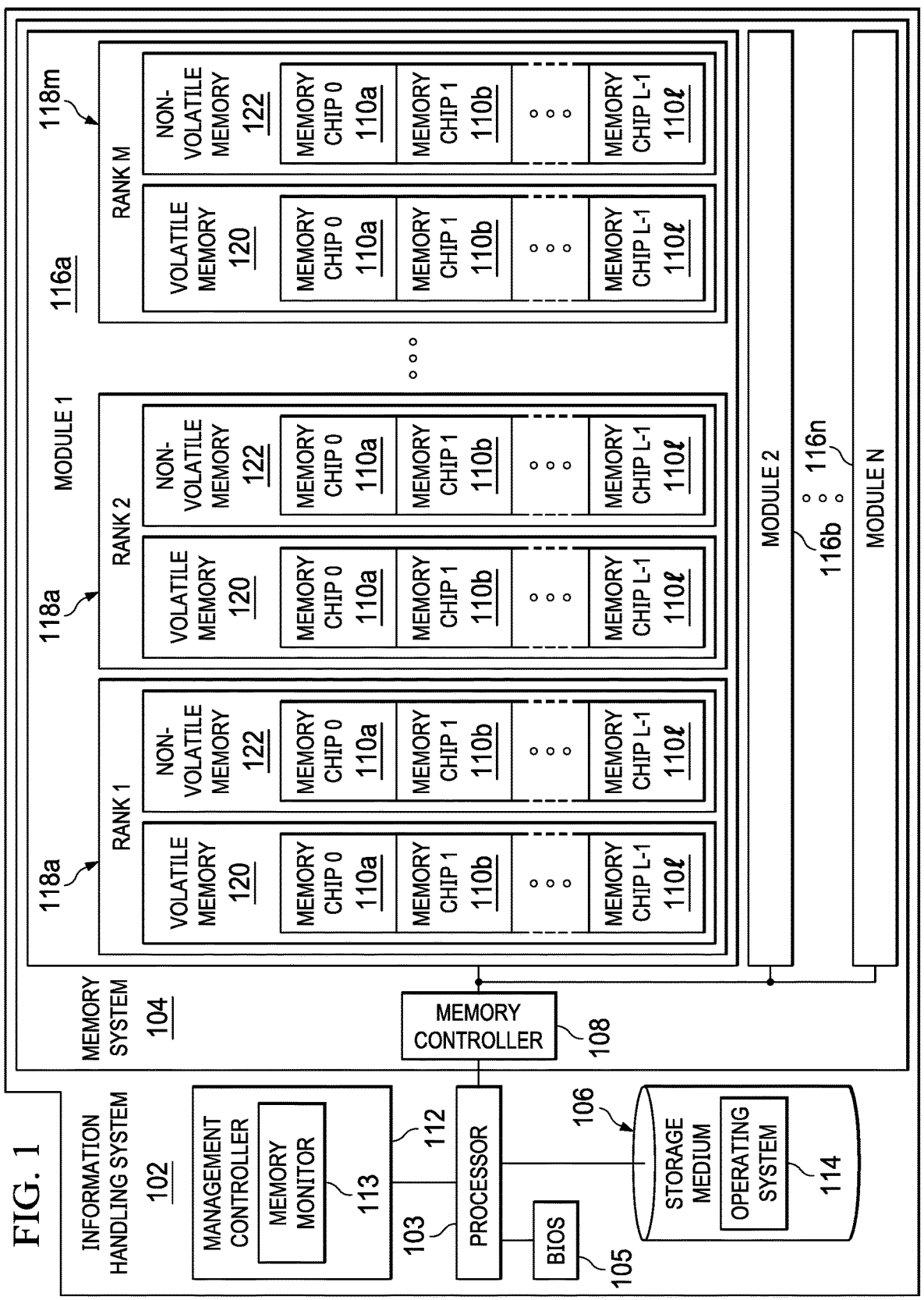
FIG. 1 illustrates a block diagram of an example information handling system in accordance with embodiments of the present disclosure.
Figure 2:
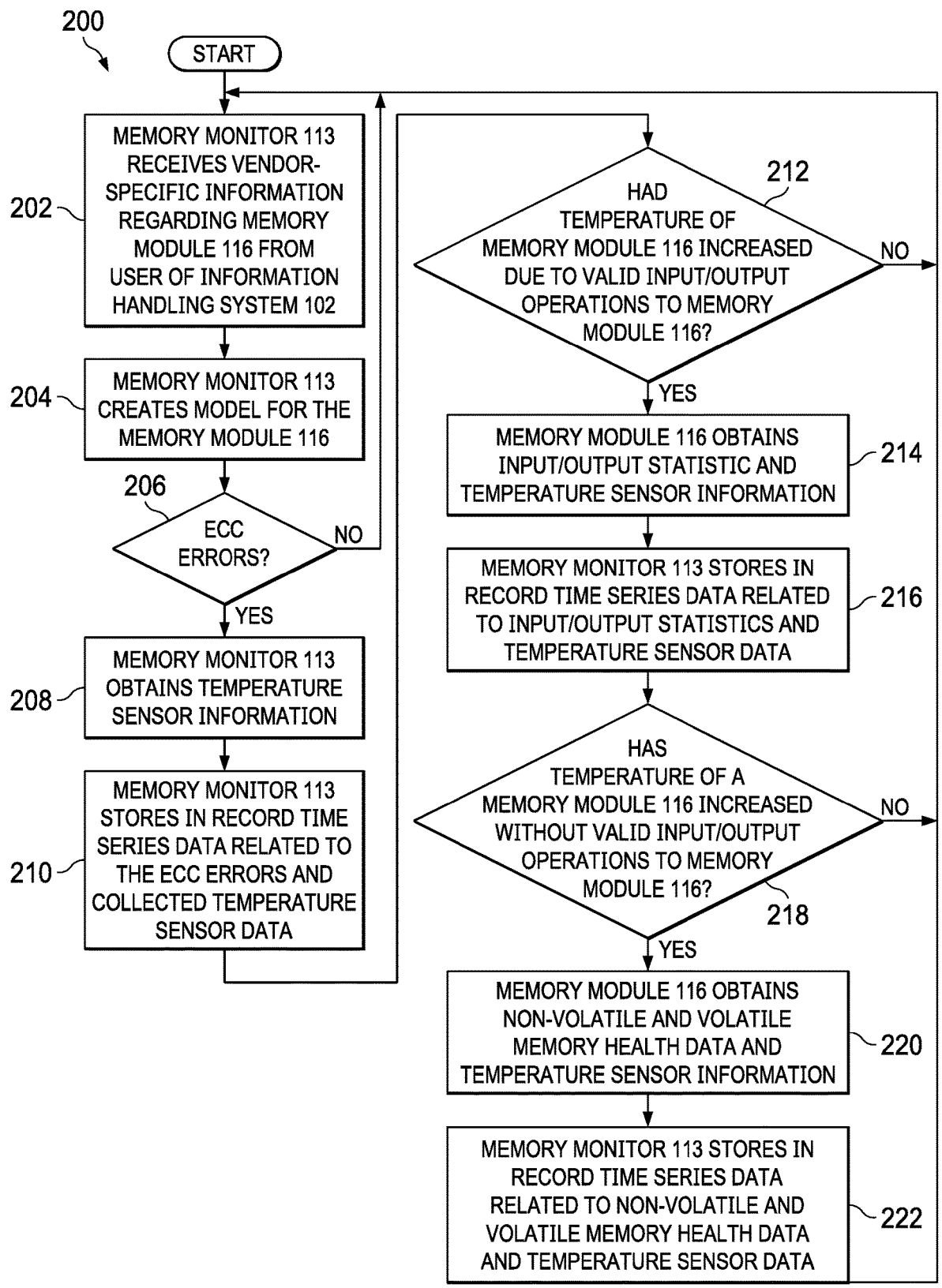
FIG. 2 illustrates a flow chart of an example method for creation of monitoring data by a memory monitor, in accordance with embodiments of the present disclosure.
Figure 3:
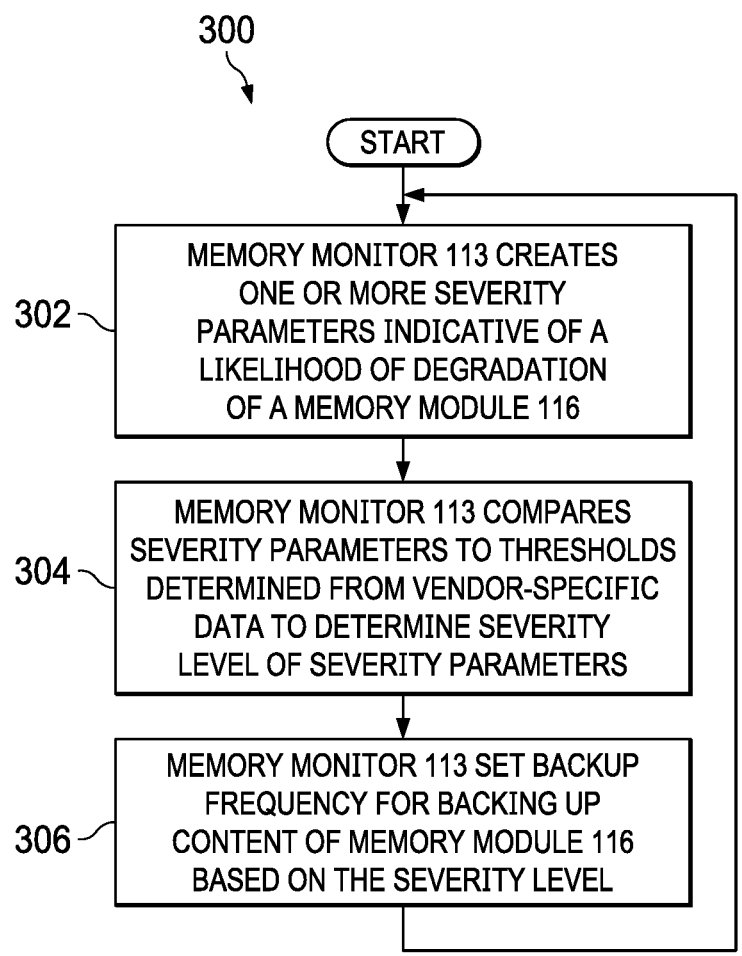
FIG. 3 illustrates a flow chart of an example method for determining memory module health and managing backup by a memory monitor, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems, buses, memories, I/O devices and/or interfaces, storage resources, network interfaces, motherboards, and/or any other components and/or elements of an information handling system.

FIG. 1 illustrates a block diagram of an example information handling system 102 in accordance with certain embodiments of the present disclosure. In certain embodiments, information handling system 102 may comprise a computer chassis or enclosure (e.g., a server chassis holding one or more server blades). In other embodiments, information handling system 102 may be a personal computer (e.g., a desktop computer or a portable computer). As depicted in FIG. 1, information handling system 102 may include a processor 103, a memory system 104 communicatively coupled to processor 103, a basic input/output system (BIOS) 105 communicatively coupled to processor 103, a storage medium 106 communicatively coupled to processor 103, and a management controller 112 communicatively coupled to processor 103.

Processor 103 may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored and/or communicated by one or more of memory system 104, BIOS 105, storage medium 106, and/or another component of information handling system 102.

Memory system 104 may be communicatively coupled to processor 103 and may comprise any system, device, or apparatus operable to retain program instructions or data for a period of time (e.g., computer-readable media). Memory system 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off. In particular embodiments, memory system 104 may comprise a persistent memory (e.g., comprising one or more NVDIMMs) that includes volatile memory (e.g., DRAM or other volatile random-access memory) and non-volatile memory (e.g., flash memory or other non-volatile memory), as described in greater detail below.

As shown in FIG. 1, memory system 104 may include memory controller 108 and one or more memory modules 116a-116n communicatively coupled to memory controller 108. Memory controller 108 may be any system, device, or apparatus configured to manage and/or control memory system 104. For example, memory controller 108 may be configured to read data from and/or write data to memory modules 116 comprising memory system 104. Additionally or alternatively, memory controller 108 may be configured to refresh memory modules 116 and/or memory chips 110 thereof in embodiments in which memory system 104 (or a portion thereof) comprises DRAM. Although memory controller 108 is shown in FIG. 1 as an integral component of memory system 104, memory controller 108 may be separate from memory system 104 and/or may be an integral portion of another component of information handling system 102 (e.g., memory controller 108 may be integrated into processor 103).

Each memory module 116 may include any system, device or apparatus configured to retain program instructions and/or data for a period of time (e.g., computer-readable media). As shown in FIG. 1, a memory module 116 may comprise a persistent memory (e.g., NVDIMM) comprising volatile memory 120 and non-volatile memory 122. In particular embodiments, memory module 116 may comprise an NVDIMM-N implementation, in which volatile memory 120 and non-volatile memory 122 exist on the same memory module 116, and memory module 116 may present only volatile memory 120 to OS 114, and any save operations are performed invisibly to OS 114 in the event of a power loss. As depicted in FIG. 1, each memory module 116 may include one or more ranks 118a-118m. Each memory rank 118 within a memory module 116 may be a block or area of data created using some or all of the memory capacity of the memory module 116. In some embodiments, each rank 118 may be a rank as such term is defined by the JEDEC Standard for memory devices.

As shown in FIG. 1, each rank 118 may include a non-volatile memory 120 and an associated non-volatile memory 122. Each rank-level volatile memory 120 may include a plurality of memory chips 110, and each rank-level non-volatile memory 122 may include a plurality of memory chips 111. Each memory chip 110 may include a packaged integrated circuit configured to comprise a plurality of volatile memory cells for storing data. In some embodiments, a memory chip 110 may include dynamic random access memory (DRAM). Each memory chip 111 may include a packaged integrated circuit configured to comprise a plurality of non-volatile memory cells for storing data. In some embodiments, a memory chip 111 may include flash memory.

During normal operation, when an electrical power source provides adequate power to components of information handling system 102, data written to memory 104 from processor 103 may be stored in volatile memory 120. However, in the event of loss of system input power or a power fault that prevents delivery of electrical energy from the power source to memory 104, data stored in volatile memory 120 may be transferred to non-volatile memory 122 in a save operation. After input power is restored, or a faulty power source is replaced, such that the power source is again operable to provide electrical energy to information handling resources of information handling system 102, on the subsequent power-on of information handling system 102, data may be copied from non-volatile memory 122 back to volatile memory 120 via a restore operation. The combined actions of data save and then data restore, allow the data to remain persistent through a power disruption. Accordingly, although not explicitly shown in FIG. 1, memory 104 may also include hardware, firmware, and/or software for carrying out save operations.

A BIOS 105 may include any system, device, or apparatus configured to identify, test, and/or initialize information handling resources of information handling system 102, and/or initialize interoperation of information handling system 102 with other information handling systems. "BIOS" may broadly refer to any system, device, or apparatus configured to perform such functionality, including without limitation, a Unified Extensible Firmware Interface (UEFI). In some embodiments, BIOS 105 may be implemented as a program of instructions that may be read by and executed on processor 103 to carry out the functionality of BIOS 105. In these and other embodiments, BIOS 105 may comprise boot firmware configured to be the first code executed by processor 103 when information handling system 102 is booted and/or powered on. As part of its initialization functionality, code for BIOS 105 may be configured to set components of information handling system 102 into a known state, so that one or more applications (e.g., an operating system or other application programs) stored on compatible media (e.g., disk drives) may be executed by processor 103 and given control of information handling system 102.

Storage medium 106 may be communicatively coupled to processor 104. Storage medium 106 may include any system, device, or apparatus operable to store information processed by processor 103. Storage medium 106 may include, for example, network attached storage, one or more direct access storage devices (e.g., hard disk drives), and/or one or more sequential access storage devices (e.g., tape drives). As shown in FIG. 1, storage medium 106 may have stored thereon an operating system (OS) 114. OS 114 may be any program of executable instructions, or aggregation of programs of executable instructions, configured to manage and/or control the allocation and usage of hardware resources such as memory, CPU time, disk space, and input and output devices, and provide an interface between such hardware resources and application programs hosted by OS 114. Active portions of OS 114 may be transferred to memory 104 for execution by processor 103.

Management controller 112 may be configured to provide management facilities for management of information handling system 102. Such management may be performed by management controller 112 even if information handling system 102 is powered off or powered to a standby state. Management controller 112 may include a processor and a management network interface separate from and physically isolated from a data network interface of information handling system 102. In certain embodiments, management controller 112 may include or may be an integral part of a baseboard management controller (BMC) or a remote access controller (e.g., a Dell Remote Access Controller or Integrated Dell Remote Access Controller).

As shown in FIG. 1, management controller 112 may comprise a memory monitor 113. Memory monitor 113 may include any system, device, or apparatus for monitoring memory system 104, as described in more detail below. In some embodiments, memory monitor 113 may comprise a program of executable instructions stored in computer readable media integral to or otherwise accessible to management controller 112 and configured to, when loaded and executed upon a processor of management controller 112, carry out the functionality of memory monitor 113 described herein.

In operation, memory monitor 113 may monitor health status of memory modules 116 of memory system 104 and initiate and manage data backup operations by correlating timer series information of various operational parameters associated with memory system 104, including without limitation errors within volatile memory 120, errors within non-volatile memory 122, and temperature sensors.

Memory monitor 113 may receive from a user (e.g., an administrator) of information handling system 102 a memory management policy for installed memory modules 116. In some embodiments, such policy may be a vendor-specific policy related to a vendor of installed memory modules 116. For example, a policy may describe vendor-specific details including a maximum operating temperature, size, maximum number of writes, etc.

Once in possession of the policy, memory monitor 113 may monitor memory system 104 and maintain a record (e.g., in a log or other data structure) of time series data related to operation of memory system 104. The record maintained by memory monitor 113 may include memory slot details, memory module identifiers (e.g., serial numbers), memory ECC errors, firmware details, temperature readings from an on-memory temperature, temperature readings external to memory system 104 of the chassis housing information handling system 102, other parameters external to memory system 104, and/or other information. Based on a correlation of the temperature sensor readings and memory ECC error information, memory monitor 113 may determine if operating temperature of a memory module 116 is causing errors in such memory module 116. Memory monitor 113 may use the foregoing data to determine a severity parameter indicative of a likelihood of degradation of a memory module 116. Based on a severity parameter for a memory module 116, memory monitor 113 may determine a backup interval for such memory module 116, and cause backup of contents of such memory module 116 in accordance with such backup interval. Backing up of contents of a memory module 116 may include transferring contents of a memory module 116 to a storage medium external to such memory module 116, including without limitation storage medium 106, an externally coupled storage device (e.g., Universal Serial Bus drive), network-attached storage, cloud-based storage, and/or any other suitable medium. Memory monitor 113 may also be configured to facilitate reconstruction of contents backed up from a memory module 116 to a replacement memory module 116.

In addition to processor 103, memory system 104, BIOS 105, storage medium 106, and management controller 112, information handling system 102 may include one or more other information handling resources.

FIG. 2 illustrates a flow chart of an example method 200 for creation of monitoring data by memory monitor 113, in accordance with embodiments of the present disclosure. According to some embodiments, method 200 may begin at step 202. As noted above, teachings of the present disclosure may be implemented in a variety of configurations of information handling system 102. As such, the preferred initialization point for method 200 and the order of the steps comprising method 200 may depend on the implementation chosen.

At step 202, memory monitor 113 may receive vendor-specific information regarding a memory module 116 from a user (e.g., administrator) of information handling system 102. Such information may include a part number, unique identifier (e.g., serial number), firmware version, maximum operating temperature, maximum number of non-volatile memory write/erase cycles, etc.). At step 204, based on such information, memory monitor 113 may create a model for the memory module 116.

At step 206, memory monitor 113 may begin monitoring memory modules 116 in accordance with the model(s) by monitoring for ECC errors. If ECC errors are present, method 200 may proceed to step 208. Otherwise, method 200 may proceed to step 212.

At step 208, in response to one or more ECC errors, memory monitor 113 may obtain temperature sensor information from temperature sensors present within memory system 104 and/or temperature sensors of the chassis of information handling system 102 external to memory system 104. At step 210, memory monitor 113 may store in a record (e.g., log or other data structure) time series data related to the ECC errors and collected temperature sensor data.

At step 212, memory monitor 113 may determine if a temperature of a memory module 116 has increased due to valid input/output operations to the memory module 116. If a temperature of a memory module 116 has increased due to valid input/output operations to the memory module 116, method 200 may proceed to step 214. Otherwise, method 200 may proceed to step 218.

At step 214, in response to a temperature of a memory module 116 increasing due to valid input/output operations to the memory module 116, memory monitor 113 may obtain input/output statistics, temperature sensor information from temperature sensors present within memory system 104, and/or temperature sensors of the chassis of information handling system 102 external to memory system 104. At step 216, memory monitor 113 may store in the record time series data related to the input/output statistics and temperature sensor information.

At step 218, memory monitor 113 may determine if a temperature of a memory module 116 has increased without valid input/output operations to the memory module 116. If a temperature of a memory module 116 has increased without valid input/output operations to the memory module 116, method 200 may proceed to step 220. Otherwise, method 200 may proceed again to step 206.

At step 220, in response to a temperature of a memory module 116 increasing without valid input/output operations to the memory module 116, memory module 116 may obtain non-volatile and volatile memory health data, temperature sensor information from temperature sensors present within memory system 104, and/or temperature sensors of the chassis of information handling system 102 external to memory system 104. At step 222, memory monitor 113 may store in the record time series data related to the non-volatile and volatile memory health data and temperature sensor information. After completion of step 222, method 200 may proceed again to step 206.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using memory monitor 113, and/or any other system operable to implement method 200. In certain embodiments, method 200 may be implemented partially or fully in software and/or firmware embodied in computer-readable media.

FIG. 3 illustrates a flow chart of an example method 300 for determining memory module health and managing backup by memory monitor 113, in accordance with embodiments of the present disclosure. According to some embodiments, method 300 may begin at step 302. As noted above, teachings of the present disclosure may be implemented in a variety of configurations of information handling system 102. As such, the preferred initialization point for method 300 and the order of the steps comprising method 300 may depend on the implementation chosen.

At step 302, memory monitor 113 may, from the record of time series data, create one or more severity parameters indicative of a likelihood of degradation of a memory module 116. For example, a severity parameter may be determined based on an analysis of a correlation between ECC errors and variance in operating temperature of the chassis or memory module 116. As another example, a severity parameter may be based on a determination of an expected lifetime of a non-volatile memory based on a size of non-volatile memory and rate of data written to the non-volatile memory. As a further example, a severity parameter may be determined based on an analysis of a correlation between Flash Translation Layer bad block management details and variance in operating temperature of the chassis or memory module 116.

At step 304, memory monitor 113 may compare such one or more severity parameters to thresholds determined from vendor-specific data to determine a severity level of the severity parameters. For example, in some embodiments, severity may be determined as critical if a severity parameter is at 80% of its relevant threshold or higher, severity may be determined as medium if a severity parameter is at 50% of its relevant threshold or higher, and may otherwise be determined as low.

At step 306, memory monitor 113 may set up a backup frequency for backing up content of a memory module 116 based on the severity level. For example, if severity is high, content may be backed up with high frequency (e.g., hourly or daily, if severity is medium, content may be backed up with intermediate frequency (e.g., bi-monthly or monthly), and if severity is low, content may be backed up with low frequency (e.g., not backed up at all). After completion of step 306, method 300 may proceed again to step 302.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using memory monitor 113, and/or any other system operable to implement method 300. In certain embodiments, method 300 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. An information handling system comprising:
   a processor; and
   a memory system communicatively coupled to the processor, the memory system comprising one or more persistent memory modules, each of the one or more persistent memory modules comprising a volatile memory and a non-volatile memory; and
   a management controller communicatively coupled to the processor and the memory system and configured to:
      correlate temperature sensor information with one or more other operational parameters associated with the one or more persistent memory modules; and
      predict a likelihood of degradation of the one or more persistent memory modules based on correlation of the temperature sensor information with the one or more other operational parameters.

2. The information handling system of claim 1, wherein the temperature sensor information comprises information indicative of a temperature of the one or more persistent memory modules.

3. The information handling system of claim 1, wherein the temperature sensor information comprises information indicative of a temperature external to the memory system.

4. The information handling system of claim 1, wherein the one or more other operational parameters comprise error correction code errors associated with the one or more persistent memory modules.

5. The information handling system of claim 1, wherein the one or more other operational parameters comprise input/output statistics associated with the one or more persistent memory modules.

6. The information handling system of claim 1, wherein the one or more other operational parameters comprise health information associated with the one or more persistent memory modules.

7. A method comprising, in an information handling system comprising a memory system comprising one or more persistent memory modules, each of the one or more persistent memory modules comprising a volatile memory and a non-volatile memory:
   correlating temperature sensor information with one or more other operational parameters associated with the one or more persistent memory modules; and
   predicting a likelihood of degradation of the one or more persistent memory modules based on correlation of the temperature sensor information with the one or more other operational parameters.

8. The method of claim 7, wherein the temperature sensor information comprises information indicative of a temperature of the one or more persistent memory modules.

9. The method of claim 7, wherein the temperature sensor information comprises information indicative of a temperature external to the memory system.

10. The method of claim 7, wherein the one or more other operational parameters comprise error correction code errors associated with the one or more persistent memory modules.

11. The method of claim 7, wherein the one or more other operational parameters comprise input/output statistics associated with the one or more persistent memory modules.

12. The method of claim 7, wherein the one or more other operational parameters comprise health information associated with the one or more persistent memory modules.

13. An article of manufacture comprising:
   a non-transitory computer-readable medium; and
   computer-executable instructions carried on the computer-readable medium, the instructions readable by a processor, the instructions, when read and executed, for causing the processor to, in an information handling system comprising a memory system comprising one or more persistent memory modules, each of the one or more persistent memory modules comprising a volatile memory and a non-volatile memory:
  correlate temperature sensor information with one or more other operational parameters associated with the one or more persistent memory modules; and
  predict a likelihood of degradation of the one or more persistent memory modules based on correlation of the temperature sensor information with the one or more other operational parameters.

14. The article of claim 13, wherein the temperature sensor information comprises information indicative of a temperature of the one or more persistent memory modules.

15. The article of claim 13, wherein the temperature sensor information comprises information indicative of a temperature external to the memory system.

16. The article of claim 13, wherein the one or more other operational parameters comprise error correction code errors associated with the one or more persistent memory modules.

17. The article of claim 13, wherein the one or more other operational parameters comprise input/output statistics associated with the one or more persistent memory modules.

18. The article of claim 13, wherein the one or more other operational parameters comprise health information associated with the one or more persistent memory modules.

* * * * *